United States Patent
Leobandung

(10) Patent No.: US 9,627,276 B2
(45) Date of Patent: *Apr. 18, 2017

(54) SELF-ALIGNED LOW DEFECT SEGMENTED III-V FINFET

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/979,820

(22) Filed: Dec. 28, 2015

(65) Prior Publication Data

US 2016/0365285 A1    Dec. 15, 2016

Related U.S. Application Data

(63) Continuation of application No. 14/737,738, filed on Jun. 12, 2015, now Pat. No. 9,293,374.

(51) Int. Cl.

| | |
|---|---|
| *H01L 21/8238* | (2006.01) |
| *H01L 29/76* | (2006.01) |
| *H01L 21/8258* | (2006.01) |
| *H01L 21/8234* | (2006.01) |
| *H01L 21/02* | (2006.01) |

(Continued)

(52) U.S. Cl.
CPC .... *H01L 21/8258* (2013.01); *H01L 21/02381* (2013.01); *H01L 21/02532* (2013.01); *H01L 21/02543* (2013.01); *H01L 21/02546* (2013.01); *H01L 21/3081* (2013.01); *H01L 21/30625* (2013.01); *H01L 21/76224* (2013.01); *H01L 21/823431* (2013.01); *H01L 21/823481* (2013.01); *H01L 27/0886* (2013.01); *H01L 29/6656* (2013.01)

(58) Field of Classification Search
CPC ............ H01L 21/8258; H01L 21/3081; H01L 29/6656; H01L 27/0886; H01L 21/823431; H01L 21/76224; H01L 21/02532; H01L 21/823481; H01L 21/02381
USPC .......................................... 438/216; 257/401
See application file for complete search history.

(56) References Cited

U.S. PATENT DOCUMENTS

| | | |
|---|---|---|
| 6,433,385 B1 | 8/2002 | Kocon et al. |
| 7,659,153 B2 | 2/2010 | Zhang et al. |

(Continued)

FOREIGN PATENT DOCUMENTS

KR    1020140005742 A    1/2014

OTHER PUBLICATIONS

List of IBM Patents or Patent Applications Treated as Related.

*Primary Examiner* — Luan C Thai
(74) *Attorney, Agent, or Firm* — Louis J. Percello; Ryan, Mason & Lewis, LLP

(57) ABSTRACT

A method includes forming one or more fin structures on a substrate, the one or more fin structures comprising a first material comprising a first lattice structure and the substrate comprising a second material comprising a second lattice structure. Forming the one or more fin structures on the substrate includes forming one or more trenches in the substrate, and growing the first material in the one or more trenches. The first lattice structure is different from the second lattice structure. The one or more fin structures are self-aligned by the one or more trenches.

20 Claims, 9 Drawing Sheets

(51) Int. Cl.
*H01L 21/308* (2006.01)
*H01L 29/66* (2006.01)
*H01L 21/762* (2006.01)
*H01L 27/088* (2006.01)
*H01L 21/306* (2006.01)

(56) References Cited

U.S. PATENT DOCUMENTS

| | | |
|---|---|---|
| 7,824,983 B2 | 11/2010 | Juengling |
| 8,324,660 B2 * | 12/2012 | Lochtefeld ........ H01L 21/02381 |
| | | 257/190 |
| 8,445,949 B2 | 5/2013 | Anderson et al. |
| 8,466,034 B2 | 6/2013 | Maszara et al. |
| 8,624,326 B2 | 1/2014 | Chen et al. |
| 9,349,594 B1 * | 5/2016 | Cheng ................. H01L 21/0259 |
| 2002/0175412 A1 | 11/2002 | Kocon et al. |
| 2007/0063224 A1 | 3/2007 | Watanabe et al. |
| 2008/0254577 A1 | 10/2008 | Zhang et al. |
| 2010/0148248 A1 | 6/2010 | Mikasa |
| 2013/0196508 A1 | 8/2013 | LiCausi |
| 2014/0175374 A1 | 6/2014 | Chang et al. |
| 2014/0339649 A1 | 11/2014 | Campi, Jr. et al. |
| 2015/0228765 A1 | 8/2015 | Han |
| 2016/0099352 A1 * | 4/2016 | Lee .................... H01L 29/0653 |
| | | 257/192 |

* cited by examiner

200

300

400

500

600

700

800

900

SELF-ALIGNED LOW DEFECT SEGMENTED III-V FINFET

BACKGROUND

Field effect transistors (FETs), which are considered semiconductor devices, have been used to make application specific integrated circuit (ASIC) devices, microprocessor devices, etc. Semiconductor devices can be made from various materials, for example, group IV semiconductor materials (e.g., silicon (Si) and Germanium (Ge)) and group III-V semiconductors materials (e.g., Gallium (Ga), Indium (In), Phosphorus (P) and Arsenic (As)). Combining the different groups of semiconductor materials in semiconductor structures provides a range of benefits, for example, increasing the functionality and performance of the semiconductor device.

SUMMARY

Embodiments described herein provide techniques for forming low-defect semiconductor devices with group III-V material fins on a silicon substrate.

For example, in one embodiment, a method includes the following steps. Forming one or more fin structures on a substrate, the one or more fin structures comprising a first material comprising a first lattice structure and the substrate comprising a second material comprising a second lattice structure. Forming the one or more fin structures on the substrate comprises forming one or more trenches in the substrate, and growing the first material in the one or more trenches. The first lattice structure is different from the second lattice structure. The one or more fin structures are self-aligned by the one or more trenches These and other features, objects and advantages of the present invention will become apparent from the following detailed description of illustrative embodiments thereof, which is to be read in connection with the accompanying drawings.

DETAILED DESCRIPTION

Illustrative embodiments of the invention will be described herein with reference to particular methods and apparatus. It is to be appreciated, however, that the invention is not limited to the specific methods and apparatus illustratively shown and described herein. Rather, embodiments of the invention are directed more broadly to techniques for generating group III-V material finFETs on a silicon substrate. Moreover, it will become apparent to those skilled in the art given the teachings herein that numerous modifications can be made to the embodiments shown that are within the scope of the present invention. That is, no limitations with respect to the specific embodiments described herein are intended or should be inferred.

Semiconductor structures having different groups of semiconductor materials can provide a range of performance benefits. However, problems arise when layering and combining various semiconductor materials. Different semiconductor materials used for forming the semiconductor structure may have varying lattice constants. Lattice mismatch occurs where two materials featuring different lattice constants are brought together by deposition of one material on top of another. Thus, when growing a semiconductor material with a second lattice constant on a semiconductor material with a first lattice constant, defects may occur, which may render the semiconductor device unusable if the defects are severe.

For example, growing group III-V material on silicon may result in defects due to the lattice mismatch of the group III-V material and the silicon. Furthermore, the extent of the defects depends on the ratio of the opening (i.e., the width) to the depth of the growth area. By increasing the width-to-depth ratio, defects resulting from the lattice mismatch can be trapped s from reaching the top of the sidewall of the opening where the devices are located. In addition, typically the growth near the side wall is defective and should be removed.

Advantageously, embodiments described herein provide techniques for semiconductor device manufacturing, more particularly, for forming semiconductor devices with group III-V material fins on a silicon substrate while reducing or eliminating defects resulting from lattice mismatch between the group III-V material fins and the silicon substrate. Embodiments described herein also provide techniques for removing the defective material near the sidewall in a self-aligned way.

An illustrative embodiment for forming a semiconductor structure comprising fin field effect transistors (finFETs) on silicon substrate will be described below with reference to FIGS. 1-9. Each of the structures 100 to 900 illustrate steps which may be used in the process of forming a finFET on a silicon substrate.

Figure 1A:
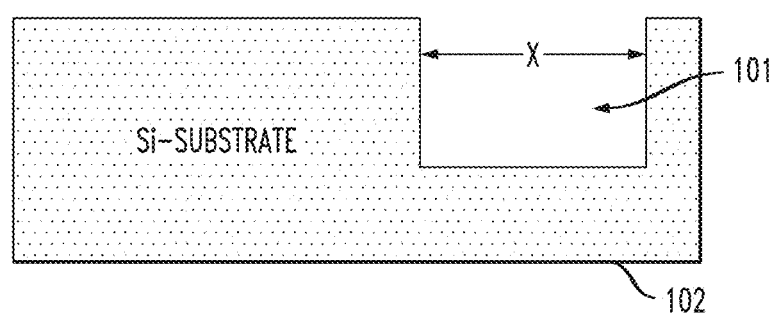
FIG. 1A illustrates a side view of a silicon substrate having an opening where group III-V material will be grown on the silicon, according to an embodiment of the invention.
Figure 1B:
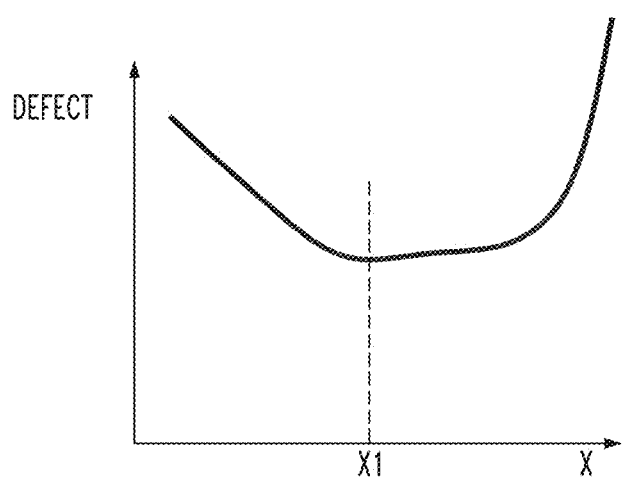
FIG. 1B illustrates an amount of defects due to lattice mismatch versus the dimensions of the opening, according to an embodiment of the invention.

FIG. 1A is a side view, illustrating formation of the semiconductor structure 100, which includes a silicon (Si) substrate 102, having a trench opening 101 in preparation for growing a group III-V material fin. The width of the opening 101 has a dimension X. FIG. 1B illustrates the extent or severity of the defects due to the lattice mismatch between the silicon substrate and the group III-V material to be grown in the opening 101 as a function of the dimension X. In FIG. 1B, it can be seen that the extent of the defects is greatest when the dimension X is either very small, e.g., less than 50 nm, or very large, e.g., larger than 0.5 µm. Therefore, it would be advantageous in some embodiments to form the opening 101 with a dimension in between, for example, dimension X1, where 50 nm<X1<0.5 µm. However, semiconductor structures that are "very small" or "very large" may also be formed in embodiments of the invention, as the severity of the defects can be reduced or eliminated using the techniques to be described below in conjunction with FIGS. 2-9.

It is to be noted that in FIGS. 2-9 below, the cross-sectional view is taken along AA in a portion of the semiconductor structure shown in dashed lines in FIG. 2A.

Figure 2A:
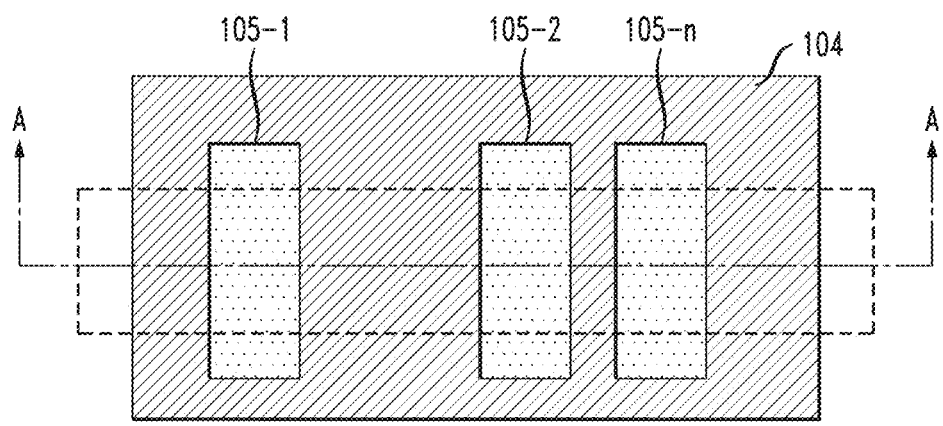
FIGS. 2A and 2B illustrate a top view and a cross-sectional view respectively of a silicon substrate after a patterned hard mask is deposited, according to an embodiment of the invention.
Figure 2B:
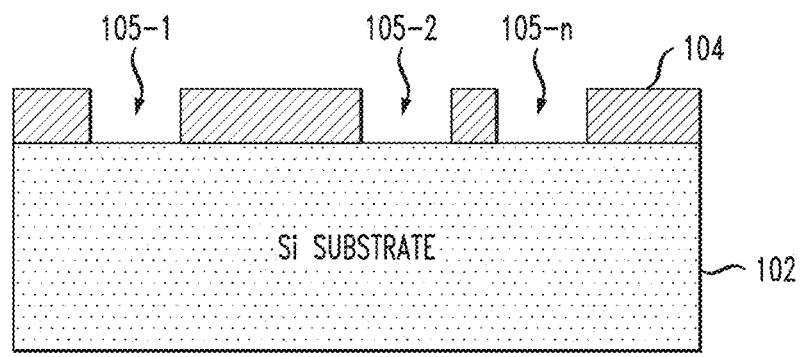

FIGS. 2A and 2B depicts a top view and a cross-sectional view taken along AA of semiconductor structure 200, respectively, which is the first step in forming the semiconductor structure. An oxide Hard Mask (HM) 104 is deposited on the surface of the silicon substrate 102. The oxide HM 104 is patterned to form openings, 105-1, 105-2, ..., 105-n, which will allow an etching process to form trenches in the silicon substrate subsequently. The oxide HM 104 is deposited to a suitable thickness depending on the application, for example, a thickness of 100 nm. The width of the openings 105-1, 105-2, ..., 105-n in oxide HM 104 is dimensioned as needed for a particular application. As described above, the width of the openings 105 may be selected to be X1 so as to minimize the defects due to the lattice mismatch between the group III-V material to be grown and the silicon substrate 102.

As shown in FIGS. 2A and 2B, the width of each of the openings 105 is substantially the same. Advantageously, keeping the width of the segments (i.e., openings and/or trenches) substantially similar to each other provide a way to optimize the process for one width. However, while each of the openings 105 shown in FIG. 2 have substantially the same width, embodiments are not so limited. In other embodiments, different ones of the openings 205 may have different widths. Moreover, while only three openings are shown in FIGS. 2A and 2B, the semiconductor structure may comprise any number of openings in the process of generating one or more finFETs.

FIG. 2B shows a first opening 105-1 and additional openings 105-2 ... 105-n. While only three openings are shown in the figure, any number of openings may be formed. As shown, the distance between the first opening 105-1 and the next opening 105-2 is greater than the distance between the second opening 105-2 and the subsequent opening 105-n. In some embodiments, the structure 200 may be used to form multiple finFETs. As an example, the first opening 105-1 may be used to align the gate for a first, relatively narrow finFET device. The other openings, 105-2 ... 105-n, may be used to align the gate for a second, relatively wide finFET device. The first finFET device may be of the same or different device type from the second finFET device. Furthermore, the semiconductor structure may contain a single or a plurality of device types (e.g., N-type, P-type). Advantageously, the relatively wide finFET device may be formed using multiple smaller openings rather than a single very large opening which may suffer from the disadvantages described above with respect to FIG. 1B. It is important to note that a single finFET device may be formed using more than two openings.

Figure 3A:
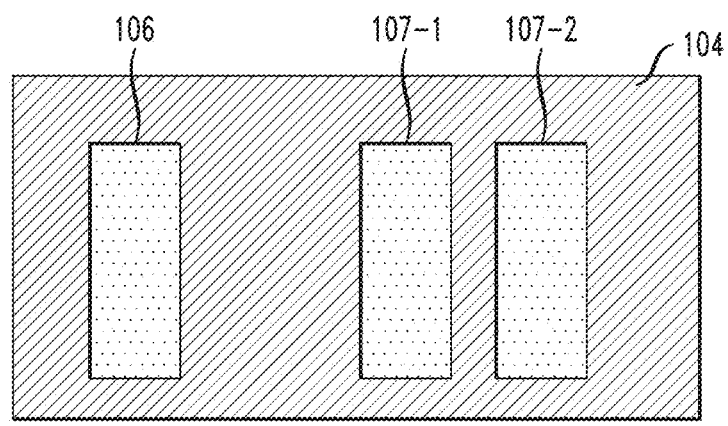
FIGS. 3A and 3B illustrate a top view and a cross-sectional view respectively of the device of FIGS. 2A and 2B after etching the substrate for a group III-V material growth region, according to an embodiment of the invention.
Figure 3B:
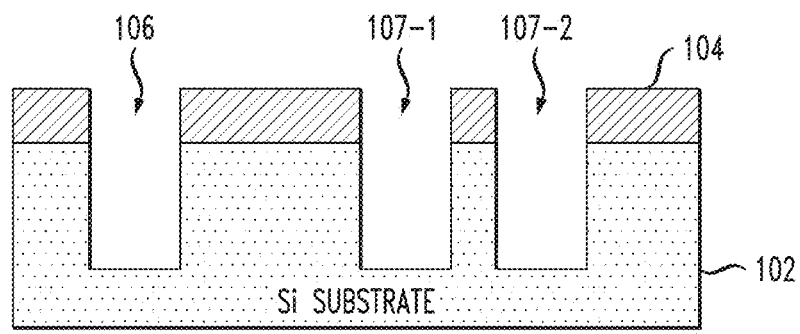

FIGS. 3A and 3B depicts a top view and a cross-sectional view of semiconductor structure 300, respectively. In this step, the silicon substrate 102 is etched using an etching process, such as a reactive ion etching process (RIE), thereby forming trenches 106, 107-1 and 107-2. In the embodiment shown, the trench 106 will be processed to form a narrow, one segment finFET device, while trenches 107-1 and 107-2 will be processed to form a wide device comprising two segments. The trenches 106, 107-1 and 107-2 will subsequently be processed for group III-V material growth. The trenches may be of any suitable depth, for example, the trenches may be etched to a depth of between 0.5 µm and 2 µm. In other embodiments, the semiconductor device may comprise any number of one segment devices and/or multi-segmented devices, the segments may be arranged in various ways according to design needs. In some embodiments, each of the segments has a width dimensioned to minimize the defects due to lattice mismatch.

Figure 4A:
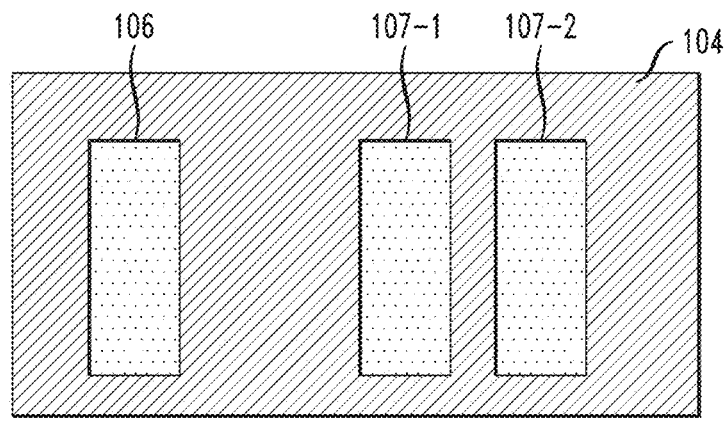
FIGS. 4A and 4B illustrate a top view and a cross-sectional view respectively of the device of FIGS. 3A and 3B after depositing an oxide on the sidewalls of the etched regions, according to an embodiment of the invention.
Figure 4B:
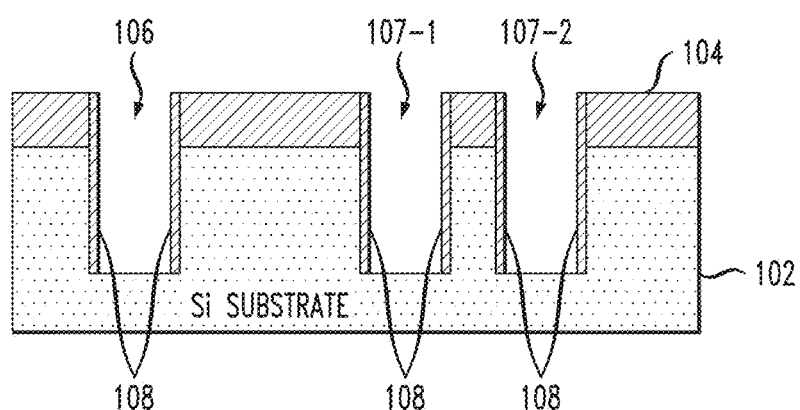

FIGS. 4A and 4B depicts a top view and a cross-sectional view of semiconductor structure 400, respectively. In this next step, FIG. 4B shows an oxide 108 deposited on the sidewalls of trenches 106, 107-1 and 107-2 to protect the sidewalls prior to growing the group III-V material. In an illustrative embodiment, the protective sidewall oxide 108 may have a thickness of approximately 10 nm. In alternative embodiments, the sidewall oxide 108 may be of any suitable thicknesses.

Figure 5A:
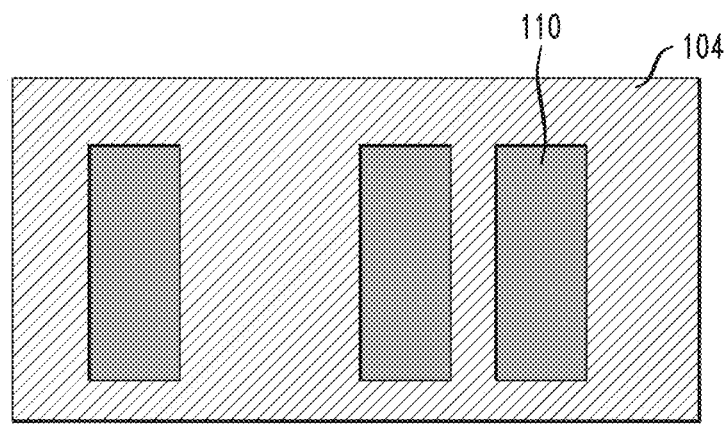
FIGS. 5A and 5B illustrate a top view and a cross-sectional view respectively of the device of FIGS. 4A and 4B after growth of group III-V material in the etched regions, according to an embodiment of the invention.
Figure 5B:
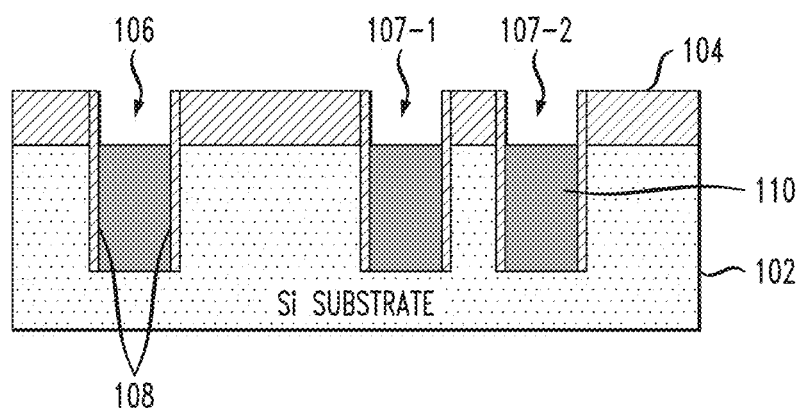

FIGS. 5A and 5B depicts a top view and a cross-sectional view, respectively, of the next step in forming the semiconductor structure 500. In structure 500, a group III-V material 110 is grown in trenches 106, 107-1 and 107-2. Examples of group III-V material may include, but not limited to indium phosphide (InP), indium aluminum arsenide (InAlAs), and indium gallium arsenide (InGaAs). The top surface of the group III-V material 110 is then planarized. The planarization process may be, for example, a chemical mechanical planarization (CMP) process, wherein the surface of the group III-V material is recessed to a level that is substantially even with the top surface of the silicon substrate 102. For example, the planarization process may recess the group III-V material approximately 100 nm, equal to the thickness of the oxide layer 104.

Figure 6A:
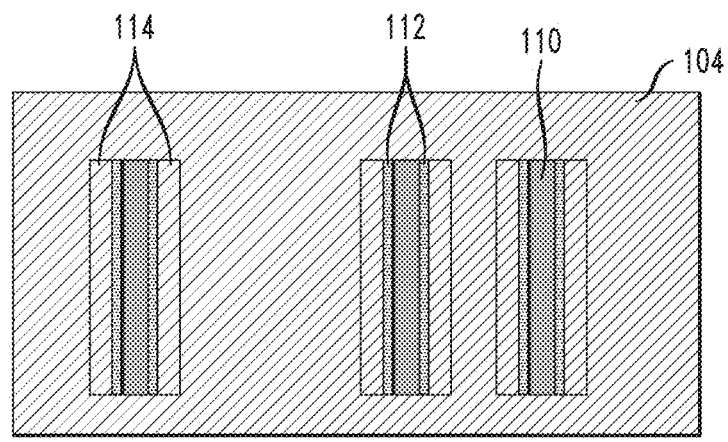
FIGS. 6A and 6B illustrate a top view and a cross-sectional view respectively of the device of FIGS. 5A and 5B after forming a second oxide spacer and a nitride hard mask (HM) on the group III-V material, according to an embodiment of the invention.
Figure 6B:
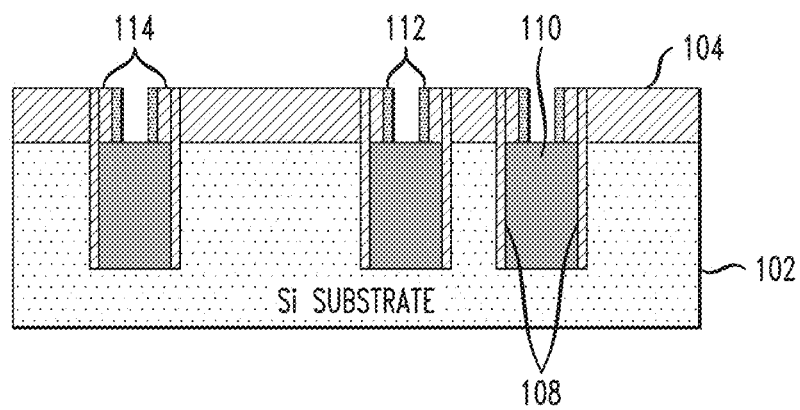

FIGS. 6A and 6B depict the next step of the process, showing a top view and a cross-sectional view of the semiconductor structure 600, respectively. In this step, oxide spacers 114 are formed on the surfaces of the group III-V material adjacent the protective sidewall oxide 108. Additionally, nitride spacers 112 are formed adjacent to oxide spacers 114. In an illustrative embodiment, the oxide spacers 114 may each have a thickness of approximately 20 nm while the nitride spacers may each have a thickness of approximately 5 nm. In alternative embodiments, the nitride spacers 112 and oxide spacers 114 may be of other suitable thickness.

Figure 7A:
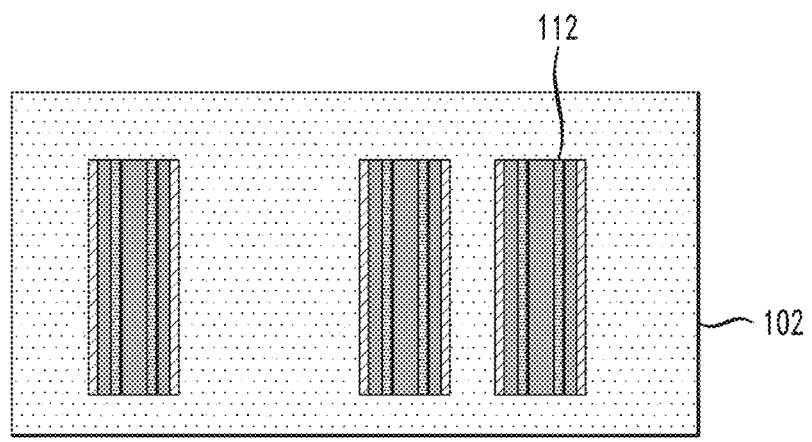
FIGS. 7A and 7B illustrate a top view and a cross-sectional view respectively of the device of FIGS. 6A and 6B after removal of the oxide layer on the substrate and group III-V material, according to an embodiment of the invention.
Figure 7B:
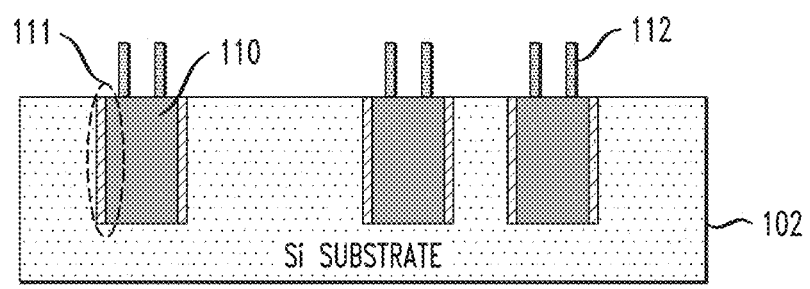

FIGS. 7A and 7B depict a top view and a cross-sectional view, respectively, of the semiconductor structure 700. In this step, the oxide layer 104, oxide spacers 114 and protective sidewall oxide 108 have been removed above the surface of silicon substrate 102, leaving nitride spacers 112 intact. The oxide layer 104, oxide spacers 114 and protective sidewall oxide 108 may be removed using a RIE process or wet etch process. As shown in FIG. 7B, a defective region 111 may form due to the defective growth from the sidewall along the trench. The defect region 111 may include defects along the sidewalls and bottom of the trenches.

Figure 8A:
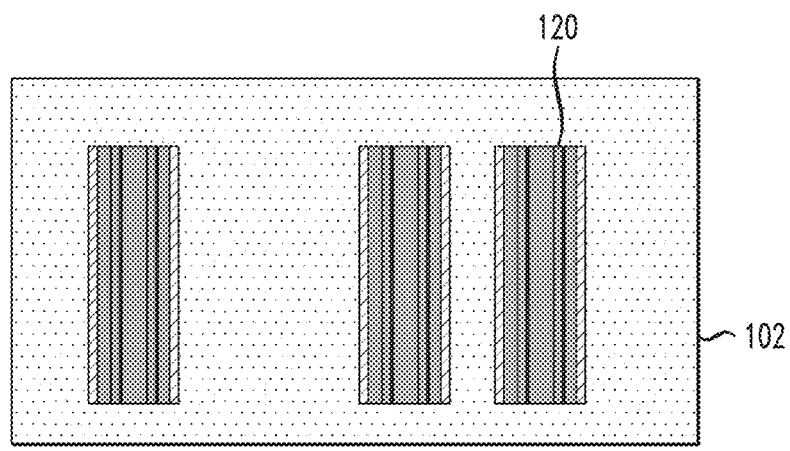
FIGS. 8A and 8B illustrate a top view and a cross-sectional view respectively of the device of FIGS. 7A and 7B after etching the substrate and group III-V material to form fins, according to an embodiment of the invention.
Figure 8B:
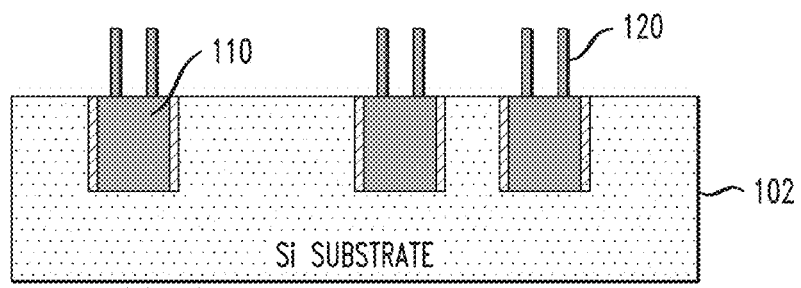

FIGS. 8A and 8B depict a top view and a cross-sectional view, respectively, of the semiconductor structure 800. In this step, the group III-V material 110, silicon substrate 102 and protective sidewall oxide 108 are etched (e.g., using a RIE process), removing the damaged edge area. The nitride spacers 112 acts as a hard mask preventing removal of the group III-V material below the nitride spacers 112 during the etching process. The nitride spacers 112 are then removed, leaving group III-V material fin structures 120 protruding from the remaining group III-V material 110. The resulting fin structures 120 are formed using a self-aligned technique, i.e., without using a mask.

Figure 9A:
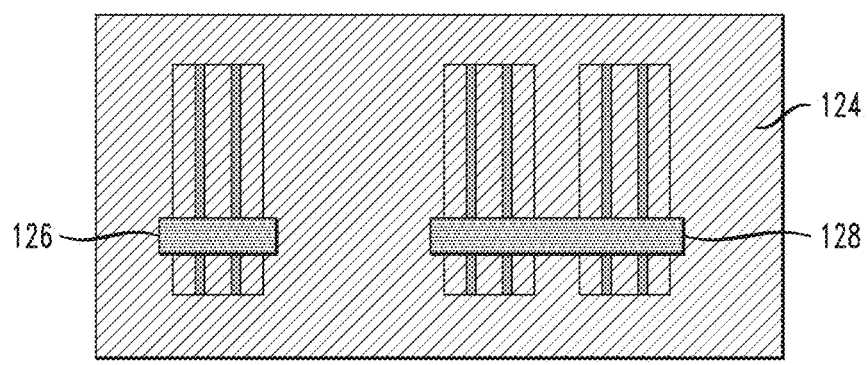
FIGS. 9A and 9B illustrate a top view and a cross-sectional view respectively of the device of FIGS. 8A and 8B after depositing a shallow trench isolation (STI) layer and forming gate electrodes on each of the fins, according to an embodiment of the invention.
Figure 9B:
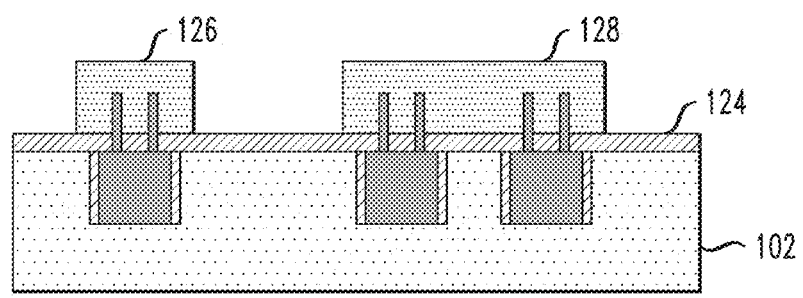

FIGS. 9A and 9B depicts a top view and a cross-sectional view of semiconductor structure 900, respectively. In this step, a shallow trench isolation (STI) material is deposited on the top surface of the silicon substrate 102 and group III-V material 110, leaving the top portion of fins 120 exposed. Suitable STI insulators may be, for example, an oxide or one or more dielectric materials such as silicon dioxide, silicon boron nitride, silicon nitride or other insulator. While not shown, the semiconductor structure 900 may be further processed to prepare the fin structures 120 for forming gate structures over the channel regions of the finFETs. Finally, gate structures 126 and 128 are formed over fin structures 120. In some embodiments, different gate materials may be used for the narrow and wide devices.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be appreciated and should be understood that the exemplary embodiments of the invention described above can be implemented in a number of different fashions. Given the teachings of the invention provided herein, one of ordinary skill in the related art will be able to contemplate other implementations of the invention. Although illustrative embodiments of the present invention have been described herein with reference to the accompanying drawings, it is to be understood that the invention is not limited to those precise embodiments, and that various other changes and modifications may be made by one skilled in art without departing from the scope or spirit of the invention.

What is claimed is:

1. A method, comprising:
    forming one or more fin structures on a substrate, the one or more fin structures comprising a first material comprising a first lattice structure and the substrate comprising a second material comprising a second lattice structure;
    wherein forming the one or more fin structures on the substrate comprises:
        forming one or more trenches in the substrate; and
        growing the first material in the one or more trenches;
    wherein the first lattice structure is different from the second lattice structure; and
    wherein the one or more fin structures are self-aligned by the one or more trenches.

2. The method of claim 1, wherein the width of each of the one or more trenches is in the range of 50 nm to 0.5 μm.

3. The method of claim 1, wherein the first material comprises a group III-V material, and the second material comprises a group IV material.

4. The method of claim 3, wherein the first material is selected from indium phosphide, indium aluminum arsenide, and indium gallium arsenide.

5. The method of claim 3, wherein the second material is one of silicon and silicon germanium.

6. The method of claim 1, further comprising:
    forming an oxide hard mask on a top surface of the substrate;
    patterning the oxide hard mark to form one or more openings; and
    etching the one or more openings to form the one or more trenches.

7. The method of claim 6, wherein the one or more openings are etched into the substrate to a depth ranging from 0.5 μm to 2 μm.

8. The method of claim 1, further comprising depositing a first spacer comprising an oxide on one or more sidewalls of each of the one or more trenches.

9. The method of claim 1, further comprising planarizing the first material in the one or more trenches and recessing the first material to a top surface of the substrate.

10. The method of claim 9, further comprising forming a second spacer adjacent to the first spacer on a portion of the one or more sidewalls extending above the top surface of the first material.

11. The method of claim 10, further comprising forming a nitride adjacent to the second spacer.

12. The method of claim 11, further comprising removing the oxide above the top surfaces of the substrate and first material.

13. The method of claim 12, further comprising etching an upper surface of the substrate and first material to form one or more fin structures on the surface of the first material.

14. The method of claim 13, wherein etching the upper surface of the substrate and the first material comprises removing a portion of the sidewalls of the trenches proximate a top of the trenches.

15. The method of claim 13, further comprising depositing a shallow trench isolation (STI) insulator on the surface of the remaining substrate and first material, leaving the one or more fin structures exposed.

16. The method of claim 15, further comprising forming one or more gates regions over the one or more fin structures to form one or more fin field effect transistor (finFET) devices.

17. The method of claim 1, wherein forming the one or more fin structures on the substrate comprises:
    forming a first finFET device comprising a first number of trenches; and forming a second finFET device comprising a second number of trenches different than the first number of trenches.

18. The method of claim 17, wherein each of the one or more trenches has a same width.

19. A semiconductor structure, comprising:
one or more fin structures formed on a substrate, the one or more fin structures comprising a first material comprising a first lattice structure and the substrate comprising a second material comprising a second lattice structure;
wherein forming the one or more fin structures on the substrate comprises:
forming one or more trenches in the substrate; and
growing the first material in the one or more trenches;
wherein the first lattice structure is different from the second lattice structure; and
wherein the one or more fin structures are self-aligned by the one or more trenches.

20. An integrated circuit, comprising:
one or more semiconductor structures, wherein each of the one or more semiconductor structures comprise:
one or more fin structures formed on a substrate, the one or more fin structures comprising a first material comprising a first lattice structure and the substrate comprising a second material comprising a second lattice structure;
wherein forming the one or more fin structures on the substrate comprises:
forming one or more trenches in the substrate; and
growing the first material in the one or more trenches;
wherein the first lattice structure is different from the second lattice structure; and
wherein the one or more fin structures are self-aligned by the one or more trenches.

\* \* \* \* \*